(12) United States Patent
Schade et al.

(10) Patent No.: US 12,543,596 B2
(45) Date of Patent: Feb. 3, 2026

(54) POWER SEMICONDUCTOR MODULE

(71) Applicant: SEMIKRON ELEKTRONIK GMBH & CO. KG, Nuremberg (DE)

(72) Inventors: Manuel Schade, Fürth (DE); Alexander Wehner, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 765 days.

(21) Appl. No.: 17/743,222

(22) Filed: May 12, 2022

(65) Prior Publication Data

US 2022/0384394 A1    Dec. 1, 2022

(30) Foreign Application Priority Data

May 28, 2021    (DE) ..................... 10 2021 113 870.1

(51) Int. Cl.
*H01L 23/367*    (2006.01)
*H01L 23/498*    (2006.01)
*H01L 25/07*    (2006.01)

(52) U.S. Cl.
CPC ........ *H01L 25/072* (2013.01); *H01L 23/3672* (2013.01); *H01L 23/49833* (2013.01); *H01L 23/49844* (2013.01); *H01L 23/4985* (2013.01)

(58) Field of Classification Search
CPC ................. H01L 23/36; H01L 23/3672; H01L 23/49833; H01L 23/49844; H01L 23/4985; H01L 24/72; H01L 25/072
See application file for complete search history.

(56) References Cited

U.S. PATENT DOCUMENTS 9,196,572 B2 *  11/2015  Steger ................. H01L 23/5387
10,090,774 B1 *  10/2018  Beckedahl ............ H02M 7/003
(Continued)

FOREIGN PATENT DOCUMENTS

DE    102005050534 B4 *  8/2008    ............. H01L 24/72
DE    102012218868 B3 *  11/2013   ......... H01L 23/3735
(Continued)

OTHER PUBLICATIONS

Deutsches Patent Und Markenamt (German Patent and Trademark Office), Examination Report in DE 10 2021 113 870.1, issued Jan. 26, 2022, 6 pgs German, 6 pgs English (machine translation).
(Continued)

*Primary Examiner* — Telly D Green
(74) *Attorney, Agent, or Firm* — Andrew F. Young, ESQ.; Nolte Lackenbach Siegel (57)    ABSTRACT

A power semiconductor module includes a flexible first substrate and a flexible second substrate and a first and second power semiconductor switch arranged between the first and second substrate. The first substrate has an electrically conductive first metal layer facing towards the power semiconductor switches, an electrically conductive second metal layer and an electrically non-conductive first insulation film arranged between the first and second metal layer. The second substrate has an electrically non-conductive second insulation film and a third metal layer arranged on the second insulation film. The first and second power semiconductor switch are electrically interconnected by the first and second substrate to form a half-bridge circuit.

10 Claims, 6 Drawing Sheets

(56) References Cited

U.S. PATENT DOCUMENTS

| | | | | |
|---|---|---|---|---|
| 2014/0103519 A1* | 4/2014 | Steger | ................ | H01L 23/3735 |
| | | | | 257/734 |
| 2018/0061802 A1* | 3/2018 | Beck | .................... | H01L 23/473 |
| 2020/0176360 A1 | 6/2020 | Kapusta et al. | | |

FOREIGN PATENT DOCUMENTS

| | | | | | |
|---|---|---|---|---|---|
| DE | 102016112779 A1 * | 1/2018 | ............. | H01L 23/32 |
| DE | 102016117248 A1 * | 3/2018 | ............. | H01L 23/48 |
| DE | 102017100328 A1 * | 7/2018 | ........... | H01L 23/367 |
| DE | 102017109706 B3 | 8/2018 | | |
| DE | 102017117665 A1 * | 2/2019 | ........ | H01L 23/49811 |
| DE | 102017125052 A1 * | 5/2019 | ............. | H01L 23/32 |
| DE | 10 2021 113 870.1 | 5/2021 | | |
| DE | 10 2021 113 870 A1 | 12/2022 | | |

OTHER PUBLICATIONS

Semikron Elektronik GMBH & Co. KG, Response and Amendment in DE 10 2021 113 870.1, filed May 19, 2022, 33 pgs German, 33pgs English (machine translation).

\* cited by examiner

POWER SEMICONDUCTOR MODULE

CROSS REFERENCE TO RELATED APPLICATIONS

This application relates to and claims priority to DE 10 2021 113 870.1 filed May 28, 2021, the entire contents of which are incorporated herein fully by reference.

FIGURE SELECTED FOR PUBLICATION

FIG. 1.

BACKGROUND OF THE INVENTION

Field of the Invention

This invention relates to a power semiconductor module.

Description of the Related Art

DE 10 2017 109 706 B3 discloses a power semiconductor module comprising a first and a second flat conductor connection element between which an electrically non-conductive insulation layer is arranged. A housing element of the power semiconductor module forms a store for the flat conductor connection elements and the insulation layer.

In order to prevent overvoltages when switching the power semiconductor switches, the technical requirement that a power semiconductor module is designed to be as low-inductance as possible is placed on said power semiconductor module.

ASPECTS AND OBJECTS OF THE INVENTION

It is the object of the invention to provide a power semiconductor module of low-inductance design.

This object is achieved by a power semiconductor module comprising a flexible first substrate and a flexible second substrate and comprising a first and second power semiconductor switch which are arranged between the first and second substrate and which each have a first and a second load current connection and a control connection, wherein the first substrate has an electrically conductive first metal layer facing towards the power semiconductor switches, an electrically conductive second metal layer and an electrically non-conductive first insulation film which is arranged between the first and second metal layer, wherein the second substrate has an electrically non-conductive second insulation film and a third metal layer arranged on the second insulation film, wherein the first and second power semiconductor switch are electrically interconnected by means of the first and second substrate to form a half-bridge circuit, wherein the half-bridge circuit has a first load potential DC voltage connection formed by a first conductor track of the first metal layer and having a first electrical polarity during operation of the power semiconductor module, a second load potential DC voltage connection formed by a conductor track of the second metal layer and having a second electrical polarity during operation of the power semiconductor module, and an AC voltage connection formed by a conductor track of the third metal layer.

It proves to be advantageous if the first load current connection of the first power semiconductor switch is arranged on the first conductor track of the first metal layer and is electrically conductively contact-connected thereto, wherein the second load current connection of the second power semiconductor switch is arranged on a second conductor track of the first metal layer and is electrically conductively contact-connected thereto, wherein the second conductor track of the first metal layer is electrically conductively connected to the conductor track of the second metal layer, in particular by means of a via running through the first insulation film, wherein the second load current connection of the first power semiconductor switch and the first load current connection of the second power semiconductor switch is electrically conductively connected to the conductor track of the third metal layer. As a result, the power semiconductor module is of particularly low-inductance design.

In this connection, it proves to be advantageous if the third metal layer is arranged facing the power semiconductor switches, and the second load current connection of the first power semiconductor switch and the first load current connection of the second power semiconductor switch is electrically conductively contact-connected to the conductor track of the third metal layer. As a result, the power semiconductor module is of particularly low-inductance design.

Furthermore, it proves to be advantageous if the second power semiconductor switch is arranged in a manner rotated by 180° with respect to the first power semiconductor switch, wherein the axis of rotation runs in a direction perpendicular to the normal direction of the first insulation film. As a result, the power semiconductor module is of particularly compact design.

In this connection, it proves to be advantageous if the control connection of the first power semiconductor switch is electrically conductively connected to a further conductor track of the second substrate and the control connection of the second power semiconductor switch is electrically conductively connected to a further conductor track of the first substrate. As a result, the electrical drive circuits of the power semiconductor module are also of low-inductance design.

In this connection, it proves to be advantageous if the further conductor track of the second substrate is a component part of the third metal layer or if the second substrate has a fourth metal layer, wherein the second insulation film is arranged between the third and fourth metal layer, wherein the further conductor track of the second substrate is a component part of the fourth metal layer. The power semiconductor module can therefore be easily adapted in terms of design depending on the desired connection of the electrical drive circuits of the power semiconductor module.

It also proves to be advantageous if the further conductor track of the first substrate is a component part of the first or second metal layer. As a result, the power semiconductor module is of particularly simple design.

Furthermore, it proves to be advantageous if an electrically non-conductive first insulation layer is arranged between the first metal layer and the third metal layer at regions at which no power semiconductor switch is arranged, wherein the first insulation layer is a component part of the first and/or second substrate. As a result, the power semiconductor module is of particularly simple design.

Furthermore, it proves advantageous if the first conductor track of the first metal layer which forms the first load potential DC voltage connection has a first connection region provided to electrically connect the power semiconductor module to an external electrical device, in particular to a DC voltage rail system, and that the conductor track of the second metal layer which forms the second load potential DC voltage connection has a second connection region provided to electrically connect the power semiconductor module to an external electrical device, in particular to a DC voltage rail system, wherein the first and second connection region are arranged above one another flush with one another, wherein no region of the second substrate is arranged flush with the first connection region in the normal direction of the first connection region. As a result, a particularly low-inductance electrical connection of the power semiconductor module to an external electrical device is made possible.

Furthermore, it proves advantageous if the conductor track of the third metal layer which forms the AC voltage connection has a third connection region provided to electrically connect the power semiconductor module to a further external electrical device, in particular to an electric motor, wherein no region of the first substrate is arranged flush with the third connection region in the normal direction of the third connection region. As a result, a particularly low-inductance electrical connection of the power semiconductor module to a further external electrical device is made possible.

Furthermore, it proves advantageous if the first substrate has an electrically non-conductive second insulation layer, the side of which facing away from the second substrate forms an outer side of the substrate facing away from the second substrate. By means of the second insulation layer, electrical insulation of the power semiconductor module from a base plate can easily be achieved when the first substrate is arranged on a base plate.

Furthermore, it proves to be advantageous if the power semiconductor module has a pressure device comprising pressure knobs, wherein the pressure knobs are arranged flush with the power semiconductor switches above the power semiconductor switches, wherein the second substrate is arranged between the pressure knobs and the power semiconductor switches, wherein the pressure device is designed to press the second substrate against the power semiconductor switches and the power semiconductor switches against the first substrate by means of the pressure knobs. By means of the pressure device, good thermal connection of the power semiconductor module to a base plate for efficient cooling of the power semiconductor switches can easily be achieved when the first substrate is arranged on a base plate.

Furthermore, a power electronics arrangement comprising a power semiconductor module according to the invention and comprising a first base plate, wherein the first substrate is arranged on the first base plate, proves to be advantageous. As a result, efficient cooling of the power semiconductor switches is made possible.

In this connection, it proves to be advantageous if the first base plate is a component part of a first heat sink. As a result, particularly efficient cooling of the power semiconductor switches is achieved.

Furthermore, a power electronics arrangement comprising a power semiconductor module according to the invention, wherein the power electronics arrangement has a first base plate on which the first substrate is arranged and/or has a second base plate arranged on the second substrate, proves advantageous. As a result, efficient cooling of the power semiconductor switches is made possible.

In this connection, it proves to be advantageous if the first base plate is a component part of a first heat sink and/or if the second base plate is a component part of a second heat sink. As a result, particularly efficient cooling of the power semiconductor switches is achieved.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 1:
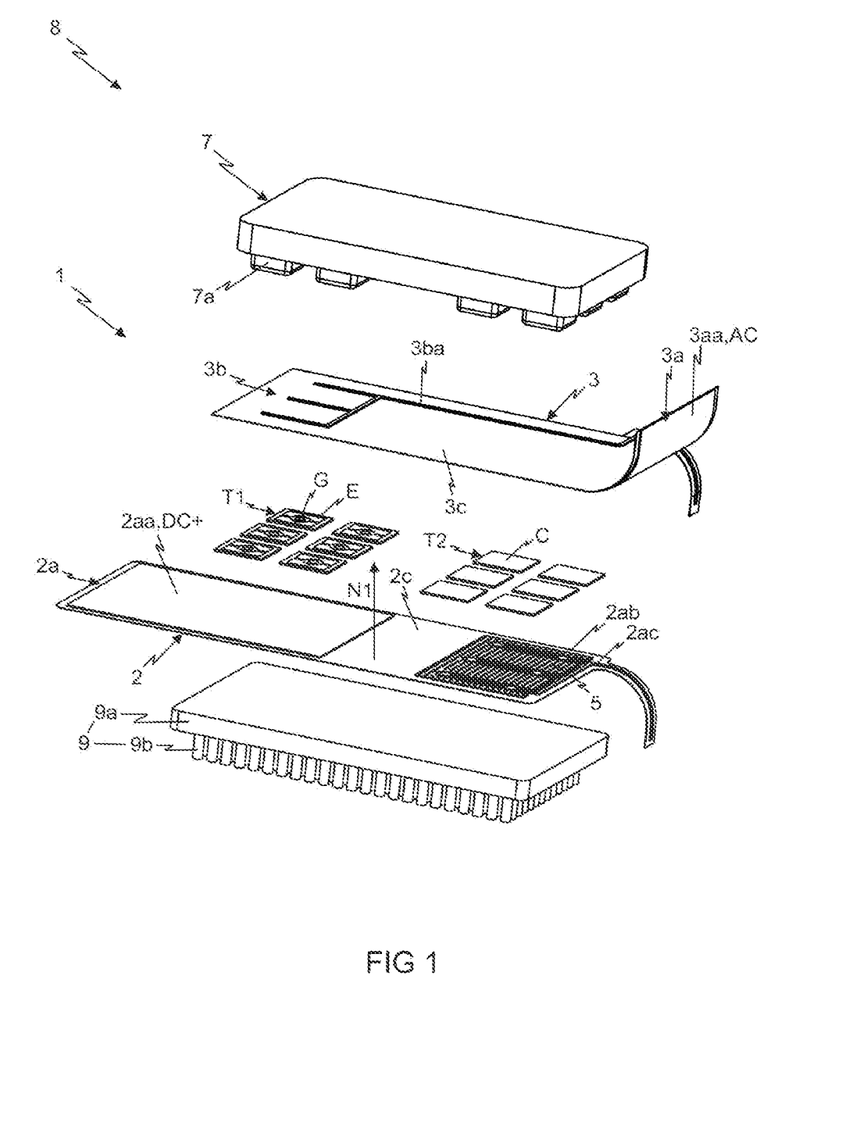
FIG. 1 shows an exploded illustration of a power electronics arrangement comprising a power semiconductor module according to the invention in a view from above.
Figure 2:
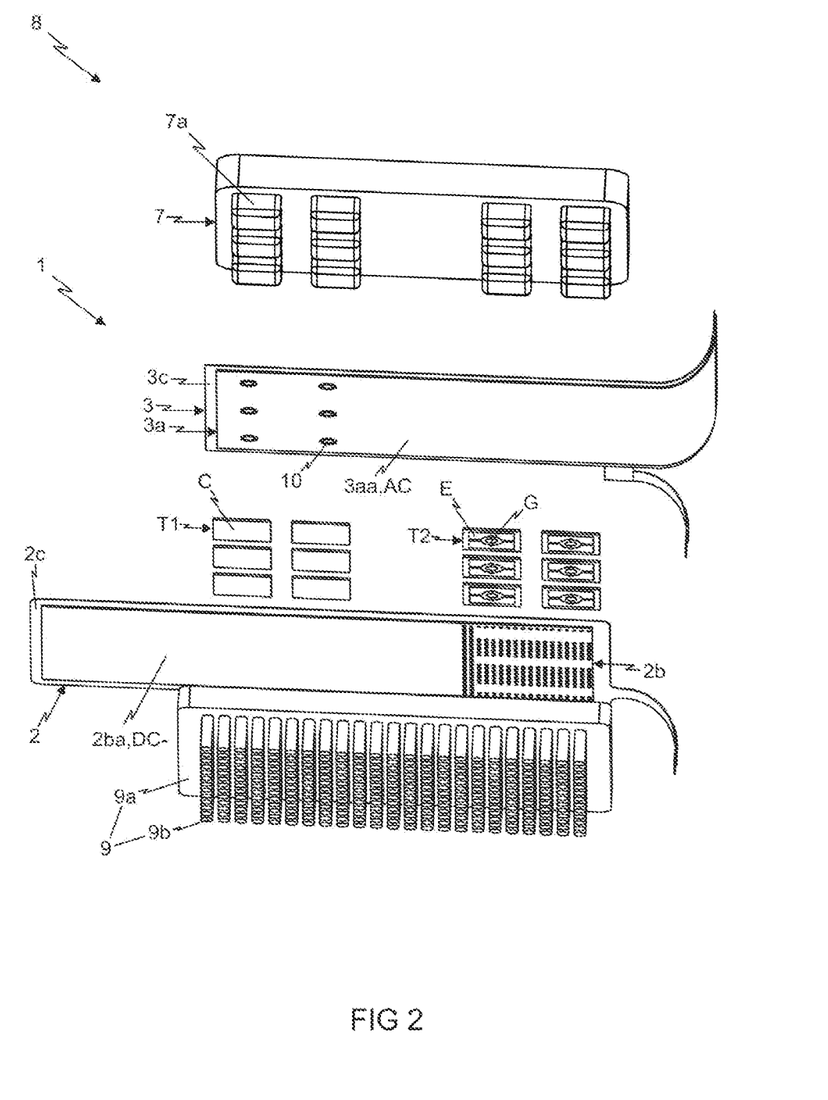
FIG. 2 shows an exploded illustration of a power electronics arrangement comprising a power semiconductor module in a view from below.
Figures 3, 4:
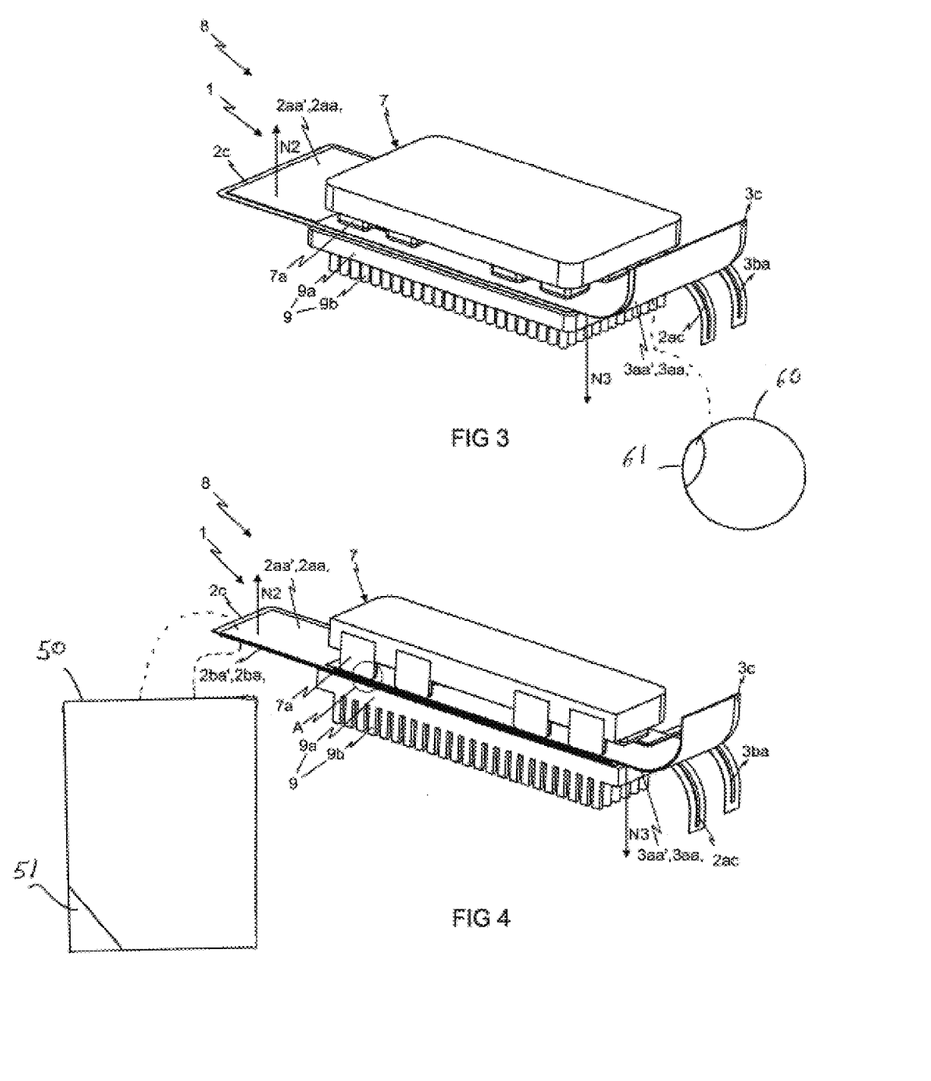
FIG. 3 shows a perspective view of a power electronics arrangement comprising a power semiconductor module according to the invention.
FIG. 4 shows a perspective sectional view of a power electronics arrangement comprising a power semiconductor module according to the invention.
Figure 5:
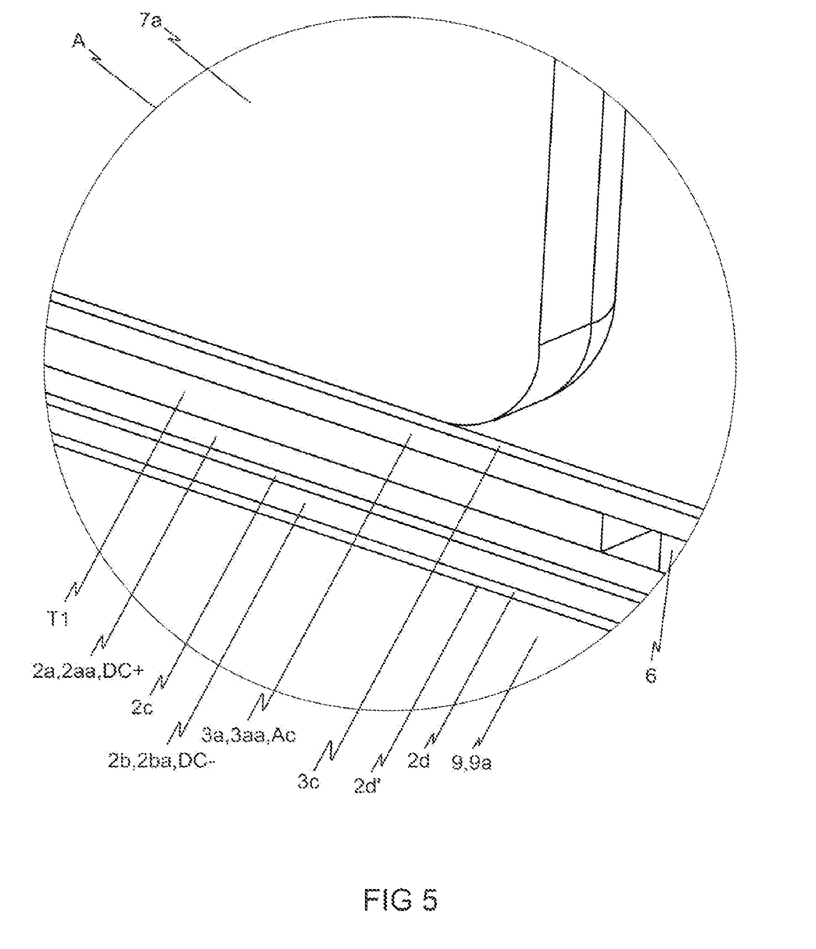
FIG. 5 shows a detail view of FIG. 4.
Figure 6:
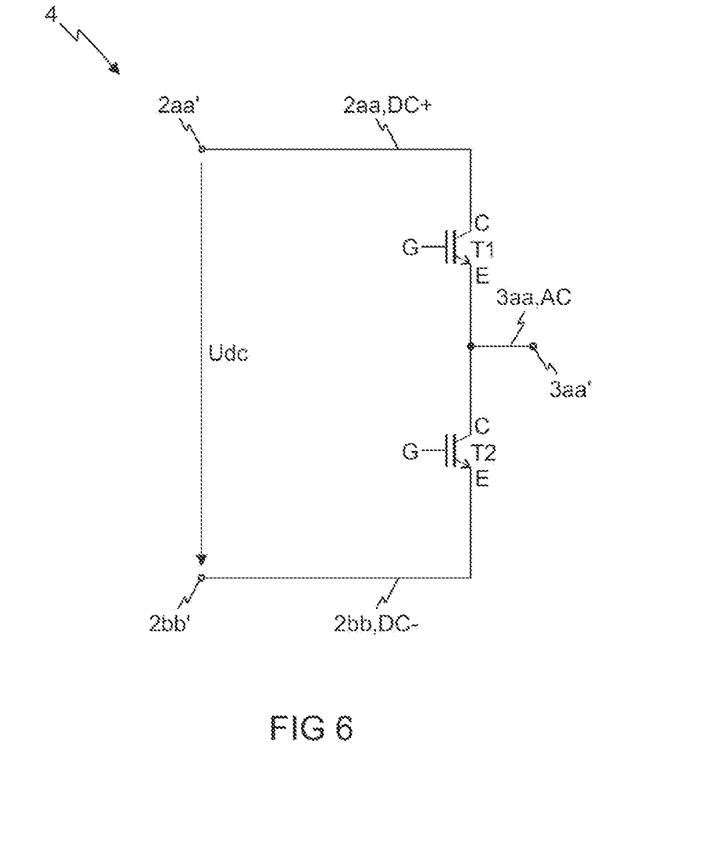
FIG. 6 shows an electrical circuit diagram of a power semiconductor module according to the invention.

FIG. 1 shows an exploded illustration of a power electronics arrangement 8 comprising a power semiconductor module 1 according to the invention in a view from above and FIG. 2 shows the same in a view from below. FIG. 3 shows a perspective view of the power electronics arrangement 8 and FIG. 4 shows a sectional view of the power electronics arrangement 8. FIG. 5 shows a section A from FIG. 4 in detail. FIG. 6 illustrates an electrical circuit diagram of the power semiconductor module 1 according to the invention.

The power semiconductor module 1 according to the invention has a flexible first substrate 2, a flexible second substrate 3 and a first and second power semiconductor switch T1 and T2, which are arranged between the first and second substrate 2 and 3 and which each have a first and a second load current connection C, E and a control connection G. The power semiconductor switches T1 and T2 are in this case generally present in the form of transistors, such as for example IGBTs (insulated-gate bipolar transistors) or MOSFETs (metal-oxide-semiconductor field-effect transistors), or in the form of thyristors.

The first substrate 2 has an electrically conductive first metal layer 2a facing towards the power semiconductor switches T1 and T2, an electrically conductive second metal layer 2b and an electrically non-conductive first insulation film 2c which is arranged between the first and second metal layer 2a and 2b. The second substrate 3 has an electrically non-conductive second insulation film 3c and a third metal layer 3a arranged on the second insulation film 3c. The respective insulation film 2c and 3c is preferably designed as a plastic film.

It should generally be noted that the respective metal layer of the first and second substrate 2 can be structured in such a way that the respective metal layer can form a plurality of conductor tracks.

The first and second power semiconductor switch T1 and T2 are electrically interconnected with one another by means of the first and second substrate 2 and 3 so as to form a half-bridge circuit 4, which is illustrated by way of example in FIG. 6. The half-bridge circuit 4 comprises the first and second power semiconductor switch T1 and T2, a first load potential DC voltage connection DC+, a second load potential DC voltage connection DC− and an AC voltage connection AC. The first load potential DC voltage connection DC+ is electrically conductively connected to the first load current connection C of the first power semiconductor switch T1. The second load current connection E of the first power semiconductor switch T1 is electrically conductively connected to the first load current connection C of the second power semiconductor switch T2 and to the AC voltage connection AC. The second load current connection E of the second power semiconductor switch T2 is electrically conductively connected to the second load potential DC voltage connection DC−. A diode can be connected in antiparallel with each of the first and second power semiconductor switch T1 and T2.

The first load potential DC voltage connection DC+ is formed by a first conductor track 2aa of the first metal layer 2a and, during operation of the power semiconductor module 1, has a first electrical polarity. The second load potential DC voltage connection DC− is formed by a second conductor track 2ba of the second metal layer 2b and, during operation of the power semiconductor module 1, has a second electrical polarity. The first polarity may be positive and the second may be negative or vice versa. The AC voltage connection AC is formed by a conductor track 3aa of the third metal layer 3a.

As a result of the fact that, on the one hand, the power semiconductor module 1 is designed to be very flat in terms of construction by means of the two substrates 2 and 3 and the power semiconductor switches T1 and T2 arranged between them and, on the other hand, the two load potential DC voltage connections DC+ and DC− are arranged on opposite main sides of the insulation film 2c and therefore run very close alongside one another, the power semiconductor module 1 is of very low-inductance design.

The first load current connection C of the first power semiconductor switch T1 is preferably arranged on the first conductor track 2aa of the first metal layer 2a and electrically conductively contact-connected thereto. The second load current connection E of the second power semiconductor switch T2 is preferably arranged on a second conductor track 2ab of the first metal layer 2a and electrically conductively contact-connected thereto. The second conductor track 2ab of the first metal layer 2a is preferably electrically conductively connected to the conductor track 2ba of the second metal layer 2b by means of a via 5 running through the first insulation film 2c. The second load current connection E of the first power semiconductor switch T1 and the first load current connection C of the second power semiconductor switch T2 is preferably electrically conductively connected to the conductor track 3aa of the third metal layer 3a.

The third metal layer 3aa is preferably arranged facing the power semiconductor switches T1 and T2, with the second load current connection E of the first power semiconductor switch T1 and the first load current connection C of the second power semiconductor switch T2 being electrically conductively contact-connected to the conductor track 3aa of the third metal layer 3a.

As in the exemplary embodiment, the second power semiconductor switch T2 is preferably arranged in a manner rotated by 180° with respect to the first power semiconductor switch T1, with the axis of rotation running in a direction perpendicular to the normal direction N1 of the first insulation film 2c.

The control connection G of the first power semiconductor switch T1 is preferably electrically conductively connected to a further conductor track 3ba of the second substrate 3 and the control connection G of the second power semiconductor switch T2 is preferably electrically conductively connected to a further conductor track 2ac of the first substrate 2. The further conductor track 3ba of the second substrate 3 can be a component part of the third metal layer 3a.

As in the exemplary embodiment, the second substrate 3 can have a fourth metal layer 3b, with the second insulation film 3c being arranged between the third and fourth metal layer 3a and 3b. As in the exemplary embodiment, the further conductor track 3ba of the second substrate 3 can also be a component part of the fourth metal layer 3b. In this case, the further conductor track 3ba of the second substrate 3 is preferably electrically conductively connected to the control connection G of the first power semiconductor switch T1 by means of a via 10 running through the second insulation film 2c.

As in the exemplary embodiment, the further conductor track 2ac of the first substrate 2 can be a component part of the first metal layer 2a or else a component part of the second metal layer 2b.

As illustrated by way of example in FIG. 5, an electrically non-conductive first insulation layer 6 can be arranged between the first metal layer 2a and the third metal layer 3a at regions at which no power semiconductor switch T1, T2 is arranged, with the first insulation layer 6 being a component part of the first and/or second substrate 2, 3. It should be noted that the insulation layer 6 is not illustrated in FIGS. 1 and 2 for the sake of clarity.

The first conductor track 2aa of the first metal layer 2a which forms the first load potential DC voltage connection DC+ preferably has a first connection region 2aa' provided to electrically connect the power semiconductor module 1 to an external electrical device 50, in particular to a DC voltage rail system 51. The conductor track 2ba of the second metal layer 2b which forms the second load potential DC voltage connection DC− preferably has a second connection region 2ba' provided to electrically connect the power semiconductor module 1 to the external electrical device 50, in particular to the DC voltage rail system 51. The first and second connection region 2aa' and 2ba' are arranged above one another flush with one another, wherein no region of the second substrate 3 is arranged flush with the first connection region 2aa' in the normal direction N2 of the first connection region 2aa'.

The conductor track 3aa of the third metal layer 3a which forms the AC voltage connection AC preferably has a third connection region 3aa' provided to electrically connect the power semiconductor module 1 to a further external electrical device 60, in particular to an electric motor 61, wherein no region of the first substrate 2 is arranged flush with the third connection region 3aa' in the normal direction N3 of the third connection region 3aa'.

The first substrate 2 preferably has an electrically non-conductive second insulation layer 2d, the side of which facing away from the second substrate 3 forms an outer side 2d' of the substrate 3 facing away from the second substrate 3 (see FIG. 5). It should be noted that the insulation layer 6 is not illustrated in FIGS. 1 and 2 for the sake of clarity.

In the context of the exemplary embodiment, the power semiconductor module 1 has a pressure device 7 comprising pressure knobs 7a preferably formed from an elastic material. The pressure knobs 7a are arranged flush with the power semiconductor switches T1 and T2 above the power semiconductor switches T1 and T2. The second substrate 3 is arranged between the pressure knobs 7a and the power semiconductor switches T1 and T2. The pressure device 7 is designed to press the second substrate 3 against the power semiconductor switches T1 and T2 and the power semiconductor switches T1 and T2 against the first substrate 2 by means of the pressure knobs 7a.

The power electronics arrangement 8 comprises the power semiconductor module 1 and a first base plate 9a, wherein the first substrate 2 is arranged on the first base plate 9a. The first base plate 9a can be designed for arrangement on a heat sink. As an alternative, as in the exemplary embodiment, the first base plate 9a can be a component part of a first heat sink 9. The first heat sink 9 preferably comprises cooling pins 9b or cooling fins which project from the first base plate 9a. The pressure device 7 presses the first substrate 2 against the base plate 9a so that the power semiconductor module 1 has a good thermal connection to the base plate 9a so that the power semiconductor switches T1 and T2 are cooled efficiently.

Figure 2A:
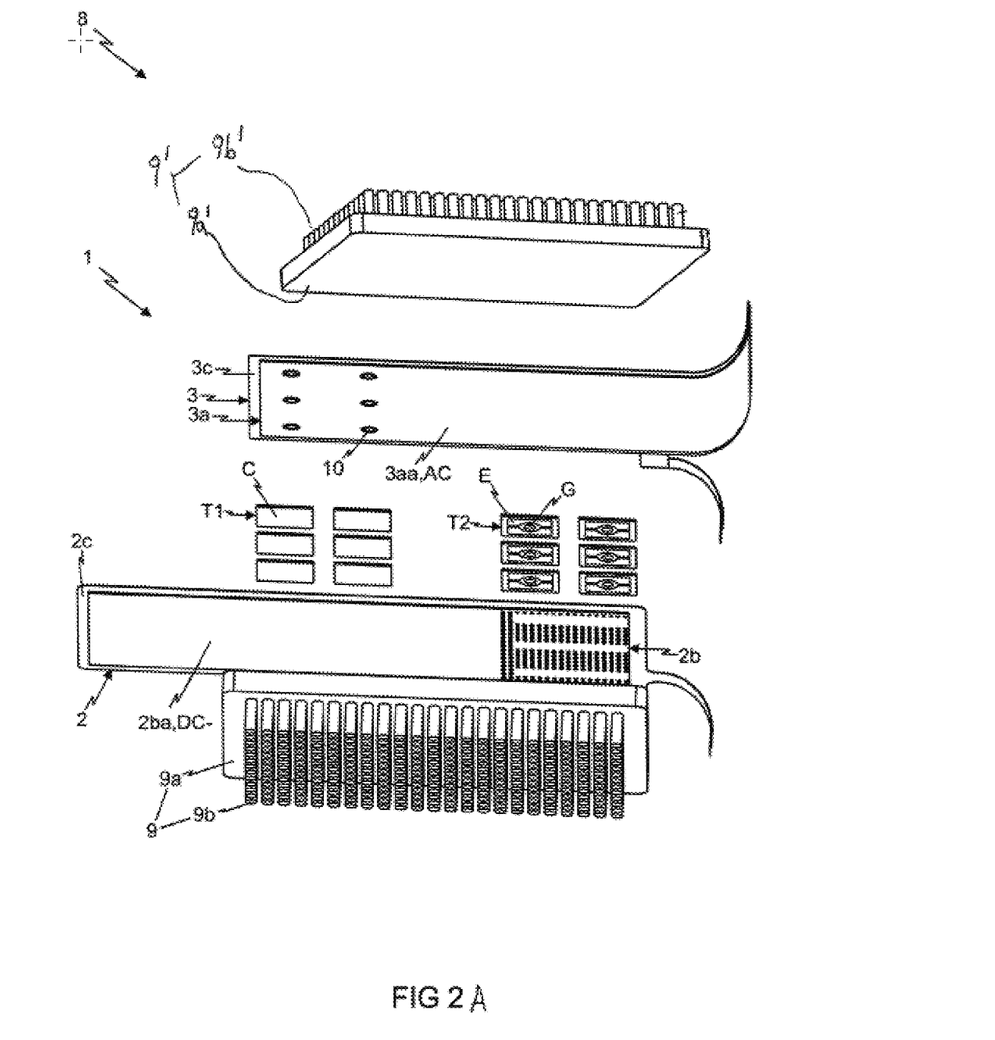
FIG. 2A is an alternative exploded illustration of a power electronics arrangement comprising a power semiconductor module in a view from below with a second base plate and a second heat sink.

Additionally referring now to FIG. 2A, if the power semiconductor module 1 does not have a pressure device 7, the power electronics arrangement 8 can then have a second base plate 9a' arranged on the second substrate 3, instead of the first base plate 9a or in addition to the first base plate 9a. The second base plate can be designed for arrangement on a second heat sink 9'. As an alternative, the second base plate 9a' can be a component part of the second heat sink 9'. The second heat sink 9a' preferably comprises cooling pins 9b' or cooling fins which project from the second base plate 9a'. The power semiconductor switches T1 and T2 can be cooled on both sides as a result.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed as invention is:

1. A power semiconductor module, comprising:
a flexible first substrate and a flexible second substrate; and further comprising:
   at least a first and a second power semiconductor switch, each of which are arranged between the flexible first substrate and the flexible second substrate and which each have a first and a second load current connection and a control connection;
   the flexible first substrate has an electrically conductive first metal layer facing towards the power semiconductor switches;
   an electrically conductive second metal layer and an electrically non-conductive first insulation film are arranged between the first and second metal layer;
   the flexible second substrate has an electrically non-conductive second insulation film and a third metal layer arranged on the second insulation film;
   the first and second power semiconductor switch are electrically interconnected by means of the first and second substrate to form a half-bridge circuit;
   the half-bridge circuit has a first load potential DC voltage connection (DC+) formed by a first conductor track of the first metal layer and has a first electrical polarity during operation of the power semiconductor module;
   the half-bridge circuit has a second load potential DC voltage connection (DC−) formed by a conductor track of the second metal layer and has a second electrical polarity during operation of the power semiconductor module;
   an AC voltage connection is formed by a conductor track of the third metal layer;
wherein the first load current connection of the first power semiconductor switch is arranged on the first conductor track of the first metal layer and is electrically conductively contact-connected thereto;
the second load current connection of the second power semiconductor switch is arranged on a second conductor track of the first metal layer and is electrically conductively contact-connected thereto;
the second conductor track of the first metal layer is electrically conductively connected to the conductor track of the second metal layer, by means of a via running through the first insulation film;
wherein the second load current connection of the first power semiconductor switch and the first load current connection of the second power semiconductor switch is electrically conductively connected to the conductor track of the third metal layer;
   wherein the second power semiconductor switch is arranged in a manner rotated by 180° with respect to the first power semiconductor switch;
wherein the axis of rotation runs in a direction perpendicular to the normal direction (N1) of the first insulation film;
   wherein the flexible first substrate has an electrically non-conductive second insulation layer having a side facing away from the flexible second substrate and forming an outer side of the flexible second substrate facing away from the flexible second substrate;

wherein the control connection of the first power semiconductor switch is electrically conductively connected to a further conductor track of the flexible second substrate;

the control connection of the second power semiconductor switch is electrically conductively connected to a further conductor track of the flexible first substrate;

wherein the flexible first substrate has an electrically non-conductive second insulation layer having a side facing away from the flexible second substrate and forming an outer side of the flexible second substrate facing away from the flexible second substrate;

wherein the power semiconductor module further comprises:

a pressure device comprising a plurality of pressure knobs;

the pressure knobs are each respectively arranged flush with the power semiconductor switches above the respective corresponding power semiconductor switches;

wherein the flexible second substrate is arranged between the pressure knobs and the power semiconductor switches;

wherein the pressure device is operably designed to press the flexible second substrate against the power semiconductor switches and the power semiconductor switches against the flexible first substrate by means of the pressure knobs;

wherein the power semiconductor module is mounted with a first base plate, wherein the flexible first substrate is arranged on the first base plate and the first base plate is a component part of a first heat sink; and wherein the power semiconductor module is mounted with a second base plate arranged on the flexible second substrate.

2. The power semiconductor module, according to claim 1, wherein:

the third metal layer is arranged facing the power semiconductor switches; and the second load current connection of the first power semiconductor switch and the first load current connection of the second power semiconductor switch is electrically conductively contact-connected to the conductor track of the third metal layer.

3. The power semiconductor module, according to claim 1, wherein:

the further conductor track of the flexible second substrate is at least one of a component part of the third metal layer and a fourth metal layer defined in the second substrate; and wherein the second insulation film is arranged between the third and the fourth metal layer.

4. The power semiconductor module, according to claim 3, wherein:

the further conductor track of the flexible second substrate is a component part of the fourth metal layer.

5. The power semiconductor module, according to claim 1, wherein:

the further conductor track of the flexible first substrate is a component part of the first or the second metal layer.

6. The power semiconductor module, according to claim 1, wherein:

an electrically non-conductive first insulation layer is arranged between the first metal layer and the third metal layer at regions at which no power semiconductor switch is arranged; and wherein the first insulation layer is a component part of one of the flexible first and the flexible second substrate.

7. The power semiconductor module, according to claim 1, wherein:

the first conductor track of the first metal layer which forms the first load potential DC voltage connection (DC+) has a first connection region provided to electrically connect the power semiconductor module to an external electrical device having a DC voltage rail system;

the conductor track of the second metal layer forms the second load potential DC voltage connection (DC−) and has a second connection region provided to electrically connect the power semiconductor module to the external electrical device having a DC voltage rail system;

the first and second connection region are arranged above one another flush with one another; and wherein no region of the flexible second substrate is arranged flush with the first connection region in the normal direction (N2) of the first connection region.

8. The power semiconductor module, according to claim 1 wherein:

the conductor track of the third metal layer forms the AC voltage connection and has a third connection region operable to electrically connect the power semiconductor module to an external electrical device having an electric motor; and wherein no region of the first flexible substrate is arranged flush with the third connection region in the normal direction of the third connection region.

9. The power semiconductor module, according to claim 1, wherein:

the flexible first substrate has an electrically non-conductive second insulation layer having a side facing away from the flexible second substrate and forming an outer side of the flexible second substrate facing away from the flexible second substrate.

10. The power electronics arrangement, according to claim 1, wherein:

the first base plate is a component part of a first heat sink and the second base plate is a component part of a second heat sink.

* * * * *